:::
United States Patent [19]

Kweon

[11] Patent Number: 5,438,328
[45] Date of Patent: Aug. 1, 1995

[54] CIRCUIT FOR MEASURING PULSE WIDTH OF REMOTE CONTROL SIGNAL

[75] Inventor: Sun-don Kweon, Seoul, Rep. of Korea

[73] Assignee: SamSung Electronics Co., Ltd., Suwon, Rep. of Korea

[21] Appl. No.: 733,593

[22] Filed: Jul. 22, 1991

[30] Foreign Application Priority Data

Oct. 16, 1990 [KR] Rep. of Korea ............... 90-16418

[51] Int. Cl.$^6$ ............................................. G08C 19/00
[52] U.S. Cl. ........................ 340/825.63; 340/825.57; 329/312; 375/340; 327/31
[58] Field of Search ............... 340/825.63, 825.64, 340/825.57, 825.72; 307/234; 329/312; 375/22, 80, 94, 95; 328/111, 112, 58, 164

[56] References Cited

U.S. PATENT DOCUMENTS

| | | | |
|---|---|---|---|
| 4,486,752 | 12/1984 | Chihak | 328/111 |
| 4,617,677 | 10/1986 | Chiba | 329/312 |
| 4,623,886 | 11/1986 | Welles | 340/825.57 |
| 4,692,710 | 9/1987 | Shvortsman | 307/234 |
| 4,763,341 | 8/1988 | Murphy | 328/111 |
| 4,897,857 | 1/1990 | Wakatsuki et al. | 375/80 |
| 5,313,199 | 5/1994 | Kwon | 340/825.57 |

Primary Examiner—John K. Peng
Assistant Examiner—Andrew Hill
Attorney, Agent, or Firm—Robert E. Bushnell

[57] ABSTRACT

A circuit for measuring a pulse width of a remote control signal comprises a receiver for receiving a remote control signal exhibiting at least one pulse; an amplifier for shaping and amplifying the received remote control signal to produce a corresponding output signal; a counter having an output which changes from first to second logic states in response to reception of a falling edge of a first pulse of the output signal and simultaneously making a first count of clock pulses that is cleared at the falling edge of each pulse of the output signal; and a microprocessor. When the value of the first count reaches a first predetermined value equivalent to an output signal pulse period and a selected delay, the output changes back to the first logic state. The selected delay is set longer than the period of each pulse so that the first count does not reach the first predetermined value before arrival of another pulse within a waveform of the output signal. A logic gate provides the clock pulses to the counter only when the counter obtains the second logic state. The microprocessor generates the clock pulses and a second count of the clock pulses starting at the falling edge of the first pulse of the output signal, stores a value of the second count when the counter output changes back to the second logic state, and measures the remote control signal waveform width by subtracting the selected delay from the second count.

27 Claims, 4 Drawing Sheets

CIRCUIT FOR MEASURING PULSE WIDTH OF REMOTE CONTROL SIGNAL

BACKGROUND OF THE INVENTION

The present invention relates to a circuit for measuring the pulse width of a remote control signal and more particularly to a circuit for accurately measuring the pulse width of a remote control signal.

Recently, in operating household electric appliances such as a television, video cassette recorder, compact disc player, audio tape recorder, etc., the use of the remote controller is becoming common and the audio/video control system which is the combination of the appliances is now being produced and sold. Since each appliance has its own remote controller, users must inconveniently have a remote controller to operate each of their appliances separately, thus requiring numerous controller devices corresponding to the number of appliances. Recently, efforts have been made to combine the functions of all of the remote controllers into one remote control device.

A reconfigurable remote control transmitter is disclosed in the U.S. Pat. No. 4,623,887.

The remote controller of the general household electric appliance has a plurality of keys and converts the remote control signal having a frequency of about 25 to 45 Khz into infrared rays according to the key operation, and transmits the same. The household electric appliance receives the transmitted infrared rays, once again converts the infrared rays back into electric signals, reads the electric signals and carries out the indicated key instructions.

Figure 1:
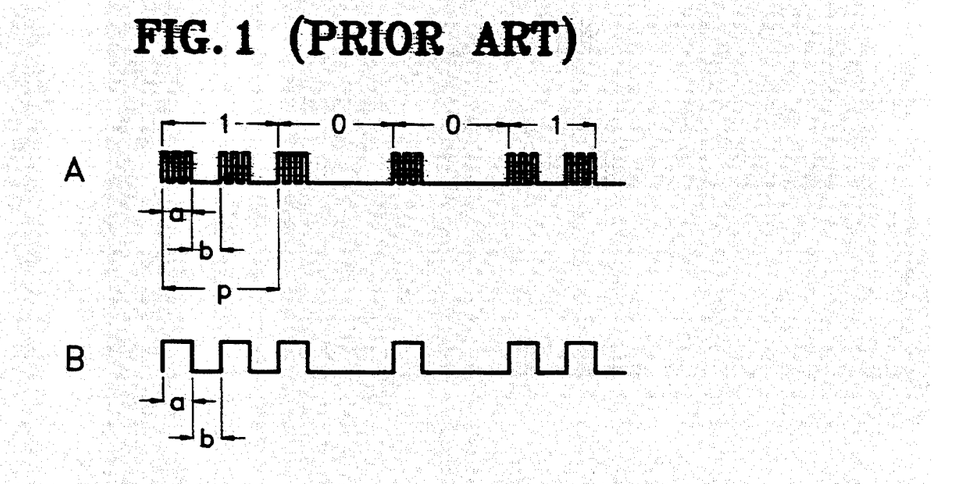
FIG. 1 is graphical representations of several modulation schemes of the general remote control signal, in which the waveform A is a remote control signal waveform having carriers and the waveform B is a remote control signal waveform having no carrier.

In the remote controller, data of digital signals, i.e., "0" and "1" as shown in FIG. 1 are formed by combining the high signal interval $t_a$ and the low signal interval $t_b$. The high signal interval $t_a$ has the signal having a carrier of a predetermined frequency (the waveform A of FIG. 1) and the signal of a signal pulse having no carrier (the waveform B of FIG. 1). The waveforms A and B of FIG. 1 represent the single/double type remote control signal system in which two high signal intervals $t_a$ within one period $t_p$ constitutes a corresponding digital signal "1", and a single high signal interval $t_a$ within one period $t_p$ constitutes a corresponding digital signal "0". In addition, other conventional types of remote control signal systems include setting the digital signals "0" and "1" by shortening and lengthening the width of the period $t_p$, setting the digital signals "0" and "1" by shortening and lengthening the duty ratio of the high signal interval $t_a$ within one period $t_p$, and setting the digital signals "0" and "1" by combining the aforementioned settings (refer to U.S. Pat. No. 4,623,887).

All of the aforementioned remote control signal systems are formed by combining of the high signal interval and the low signal interval, and are closely related with the waveform width of the remote control signal. Accordingly, to measure the remote control signal, the waveform widths need to be exactly detected.

Figure 2:
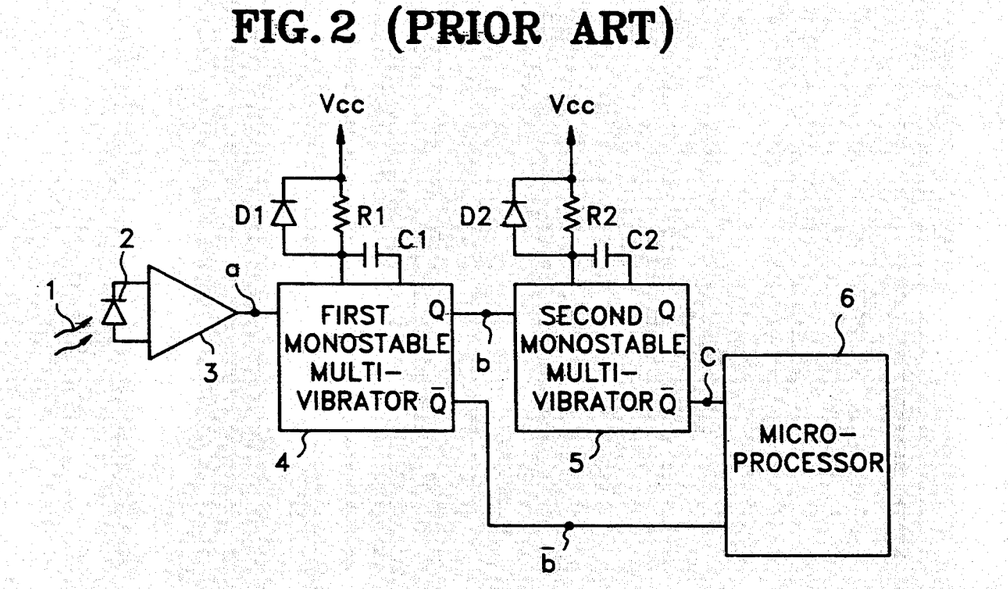
FIG. 2 illustrates a conventional circuit for measuring the waveform width of the remote control signal.

FIG. 2 is a circuit diagram of a conventional circuit for measuring the waveform width of the remote control signal. In the circuit of FIG. 2, a photodiode 2 receives the infrared ray 1 transmitted from the remote control transmitter and an amplifier 3 amplifies the output of the photodiode 2. The signal $S_a$ (not shown) at point a amplified in the amplifier 3 is received in a first monostable multivibrator 4 which generates a pulse so (not shown) at point b having a pulse width of the first time constant T1 set by the resistor R1 and the capacitor C1 whenever the input signal exists. The second monostable multivibrator 5 receives the output pulse $S_b$ of the first monostable multivibrator 4 and generates a pulse $S_c$ (not shown) at point c having the pulse width of the second time constant T2 set by the resistor R2 and the capacitor C2. When the first time constant T1 becomes shorter than the pulse width of the input signal and the second time constant T2 becomes a little bit longer than one period of the input signal, the output pulse $S_c$ of the second monostable multivibrator 5 is detected as being the envelope of the continuous input signal. This output pulse $S_c$ has a pulse width combining the input signal interval and the time constant T2 itself. Accordingly, a signal having the delay time signal T2 along with the waveform width of a high signal interval of the remote control signal appears as an output pulse $S_c$ of the second monostable mutivibrator 5.

The microprocessor 6 receives the inverted output $\overline{S_b}$ (not shown) at point $\overline{b}$ of the first monostable multivibrator to count the number of pulses of the received input signal and receives the output pulse $S_c$ of the second monostable multivibrator to measure the waveform width.

However, since the conventional circuit for measuring the waveform width of the remote control signal uses two monostable multivibrators, resistors and capacitors to detect the envelope of the input signal, exact detection of the waveform width is a problem. In detail, the resistor and the capacitor have different resistances and capacitances according to the device characteristics and the environmental temperature changes so that the error is not constant during the measuring of the waveform, and particularly there is the problem of a high error rate in the case of the waveform B of FIG. 1, which has no carrier, so the originally received waveform is not completely reproduced. That is, when the waveform width is calculated in the microprocessor 6, the error due to the delay time T2 that is included during the envelope detection should be subtracted from the reproduced waveform, but since the RC value varies according to the device characteristics and the temperature change, the error value can not be determined to be a constant value.

SUMMARY OF THE INVENTION

It is an object of the present invention to provide a circuit for measuring a waveform width of a remote control signal which can exactly measure the waveform width by setting a predetermined error value regardless of the environmental conditions, to solve the above problems in conventional techniques.

To achieve the object, the apparatus of the present invention for measuring the waveform width of the remote control signal comprises:

a receiver for receiving a remote control signal exhibiting at least one pulse transmitted by remote controller;

an amplifier for shaping and amplifying the received remote control signal to produce a corresponding output signal;

a counter coupled to the amplifier to receive the output signal for generating a counter output which changes from a first logic state to a second logic state in response to reception of a falling edge of a first pulse of the output signal and simultaneously making a first count of clock pulses that is cleared at the falling edge of each pulse of the output signal, wherein the counter output changes back to the first logic state when a value of the first count reaches a first predetermined value equivalent to a period of each pulse of the output signal and a selected delay time period, whereby the selected delay time period is longer than the period of each pulse so that the value of the first count does not reach the first predetermined value before arrival of another pulse within a waveform of the output signal;

a logic gate for controlling passage of the clock pulses to the counter in dependence upon the logic state of the counter output, wherein clock pulses are passed when the second logic state obtains; and a microprocessor coupled to the amplifier to receive the output signal, to the counter to receive the counter output, and to the logic gate to provide the clock pulses, comprising a timer for generating the clock pulses, an internal counter for making a second count of the clock pulses starting at the falling edge of the first pulse of the output signal, and a buffer memory for storing a value of the second count when the counter output changes back to the first logic state, the microprocessor measuring a waveform width of the remote control signal by subtracting a value of the selected delay time period from the value of the second count. Additionally, the microprocessor also comprises a second internal counter for counting a number of pulses of the output signal for determining whether the buffer memory is full with data, wherein the microprocessor performs a reset routine if the buffer is full.

Thus, since the aforementioned circuit of the present invention uses a counter for counting the clock pulses to a predetermined value to detect the envelope of the remote control signal, the waveform width of the remote control signal has a constant error value, which is of a predetermined value, which is detected, and since the error value is compensated (added/subtracted) in the microprocessor, the waveform width of the remote control signal can be measured more exactly.

BRIEF DESCRIPTION OF THE DRAWINGS

The above object and other advantages of the present invention will become more apparent by describing the preferred embodiment of the present invention with reference to the attached drawings, in which.

DETAILED DESCRIPTION OF THE INVENTION

Hereinafter, the present invention will be described in more detail with reference to the accompanying drawings.

Figure 3:
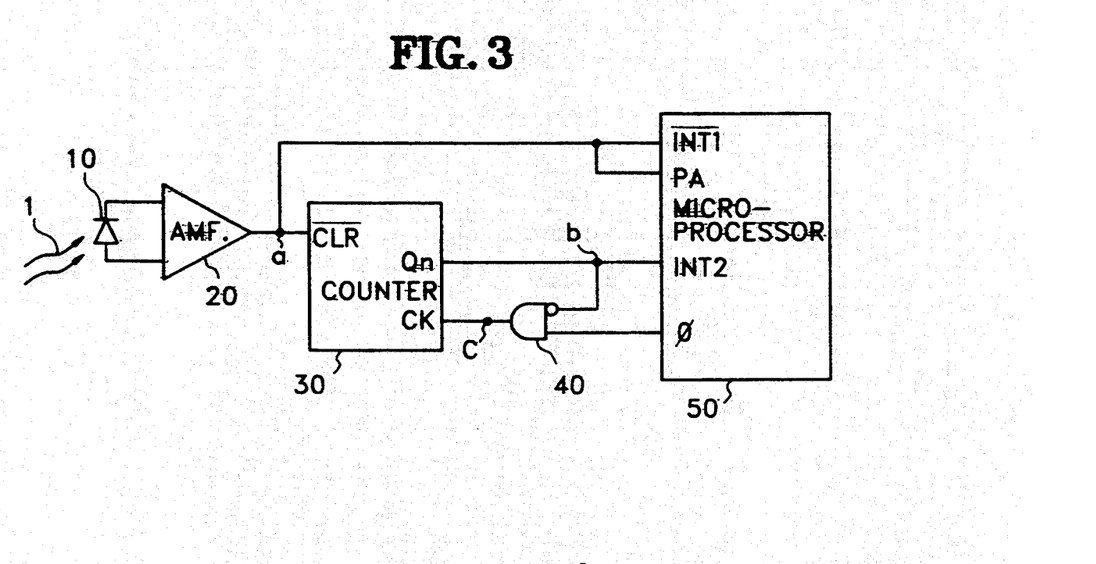
FIG. 3 illustrates a circuit for measuring the waveform width of the remote control signal according to the present invention.

FIG. 3 is a circuit diagram of the circuit for measuring the waveform width of a remote control signal according to the present invention. In FIG. 3 numeral 10 denotes a receiving device, which may actually be an infrared photodiode; numeral 20 denotes an amplifier; numeral 30 denotes a counter; numeral 40 denotes a logic gate; and numeral 50 denotes a microprocessor. The counter 30 receives output signal $S_d$ corresponding to the received remote control signal, after being shaped and amplified by the amplifier 20, through the clear terminal $\overline{CLR}$. A clock signal $S_f$ is input to clock terminal CK of counter 30 to generate a counter output that is counted via an output terminal Qn of counter 30 which corresponds to a previously set value. The logic gate 40 is an AND gate that is coupled to receive a clock signal at a non-inverted input terminal thereof from clock pulse output port $\Phi$ of microprocessor 50. Logic gate 40 is also coupled to receive an output of the output terminal Qn of counter 30 at an inverted input terminal thereof. As such, logic gate 40 provides clock pulses to the clock terminal CK of the counter 30. The microprocessor 50 is connected to the output of amplifier 20 so that the output signal $S_d$ of the amplifier 20 is supplied to input port $\overline{INT1}$ and input port PA thereof. The output terminal Qn of counter 30 is connected to input port LNT2 of microprocessor 50. A clock pulse signal output from the output port $\Phi$ is coupled to the input terminal of logic gate 40. The microprocessor 50 operates a program for measuring the waveform of the remote control signal in response to the signal supplied to the input ports $\overline{INT}$, PA, and INT2.

Figure 5:
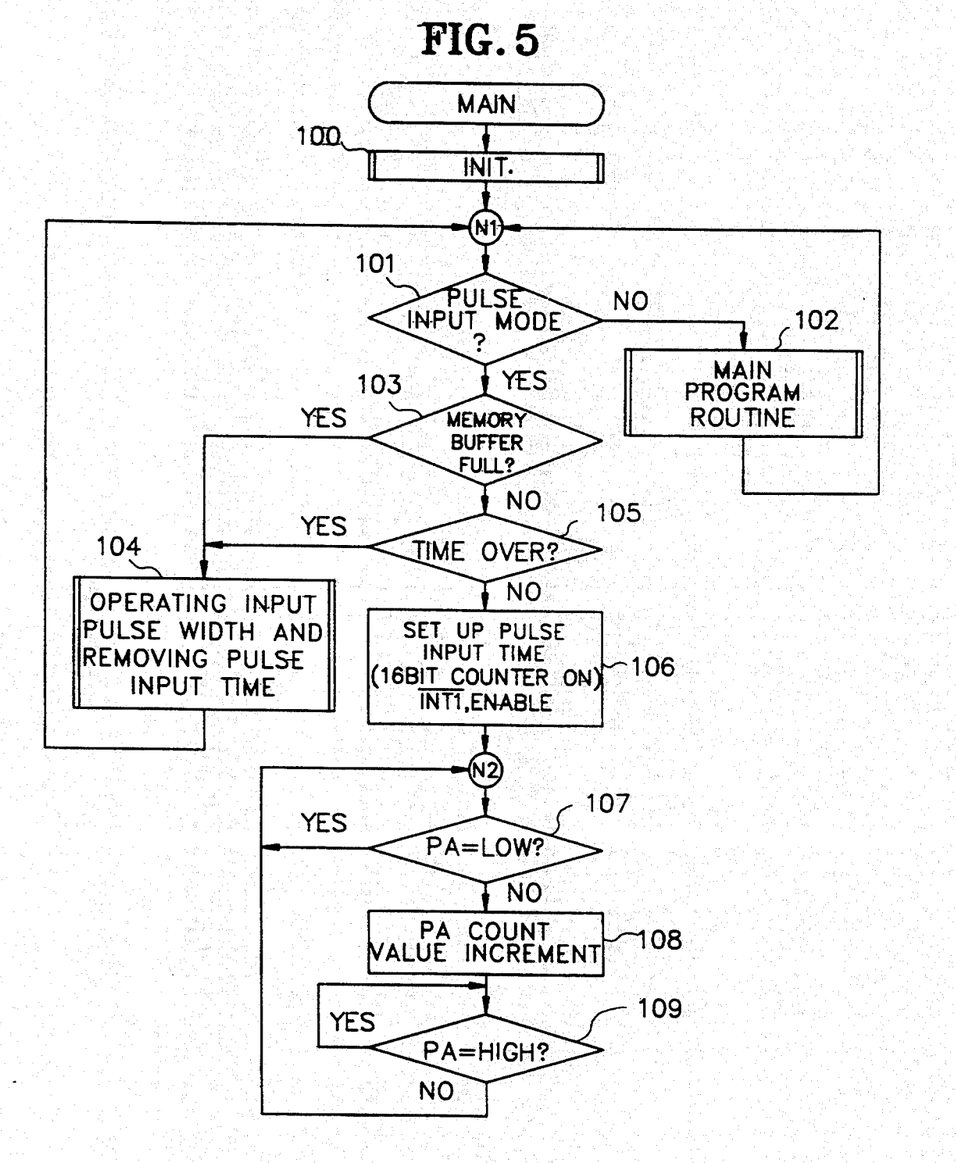
FIG. 5 is a flow chart which represents the waveform input mode routine in detail as a part of the main program according to the present invention.
Figure 6:
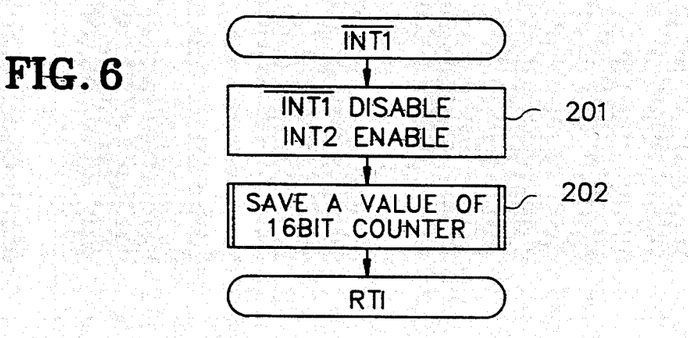
FIG. 6 is a flow chart showing the first interrupt routine according to the present invention.
Figure 7:
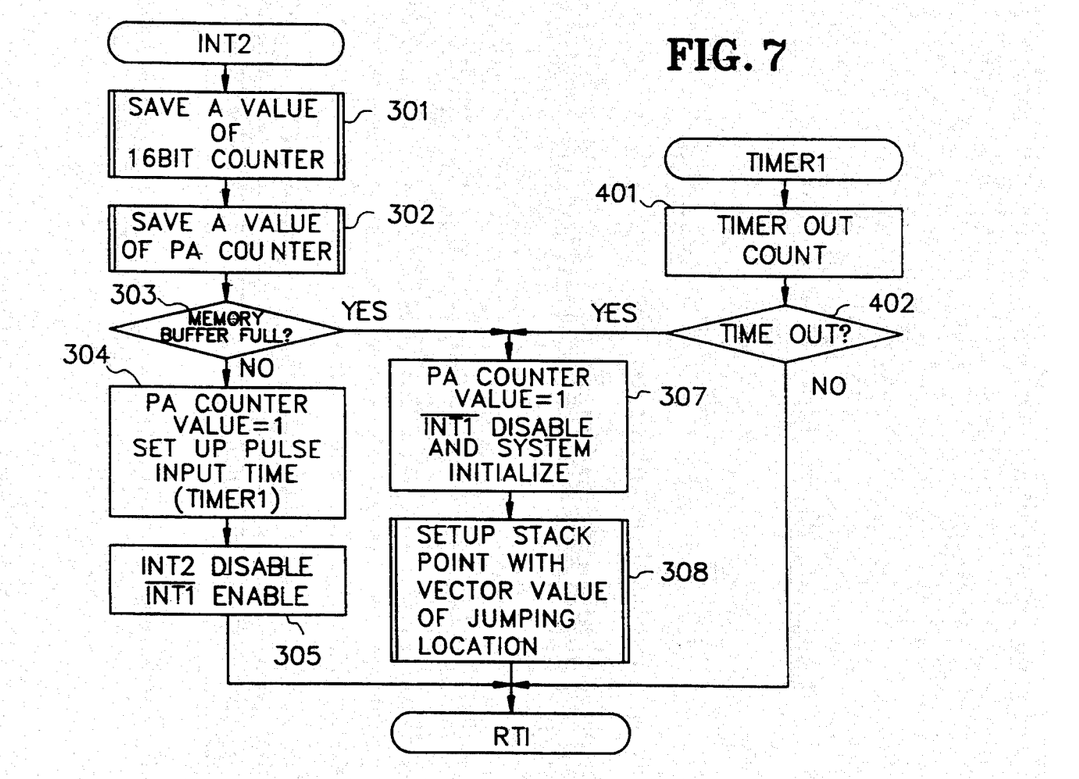
FIG. 7 is a flow chart showing the second interrupt routine and the timer routine, according to the present invention.

FIG. 5 is a flow chart of the main program for measuring the waveform of the remote control signal according to the present invention wherein only the waveform input mode routine is shown in detail. FIG. 6 illustrates a first interrupt routine corresponding to the input port $\overline{INT1}$ and FIG. 7 illustrates a second interrupt routine corresponding to the input port INT2 and a timer routine. In the main program, when the remote control key is in a continuously pressed condition, the waveform input mode is reset when the input waveform data value repletes an internal memory buffer, i.e., when it is full. When the remote control key is pressed once, the waveform input mode is also reset after a predetermined time elapses from the input of the waveform. After the first interrupt routine is carried out when an interrupt is required in the input port $\overline{INT1}$, the 16-bit counter, i.e. first internal counter, starts to operate, and the number of the pulses of the input waveform applied to the input port PA is counted by the second internal counter, i.e. in the PA counter. When an interrupt is required in the input port INT2, the second interrupt routine is carried out and then the input mode goes into a standby condition until the next waveform input.

When there is a continuous input waveform (i.e., when the remote control key is continuously pressed), the aforementioned operation is carried out repeatedly until the waveform input mode is reset by checking whether the memory buffer is full of data or not. If there is no input waveform for a specific time duration determined by an internal timer in the standby state, (i.e., if the remote control key is pressed once), the time out is checked and the waveform input mode is reset.

Figure 4A:
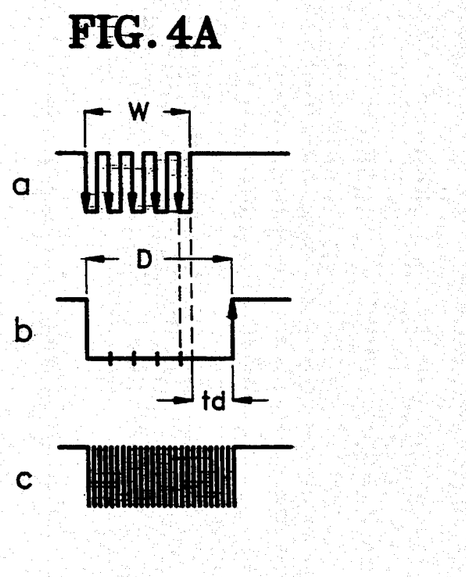
FIG. 4A shows waveforms for the respective parts of FIG. 3, when the remote control signal having a carrier is input.
Figure 4B:
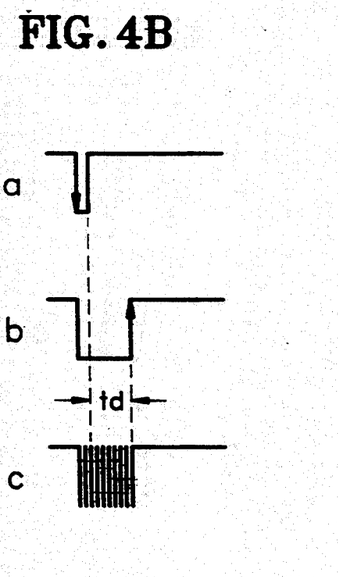
FIG. 4B shows waveforms for the respective parts of FIG. 3, when the remote control signal having no carrier is input.

Generally, in a remote control signal system having a carrier, one period of the carrier is about 10 to 32 μs and thus a selected delay time td of the counter 30 is set to about 40 μs. That is, the delay time should be set to be slightly longer than one period of the carrier, so that the envelope of the input waveform can be detected. The time for the time out is set to approximately 500 μs and when there is an absence of the input waveform, the waveform input mode is reset. The operations and the effects of the circuit for measuring the waveform width of the remote control signal according to the present invention will be described as follows:

In FIG. 3, the infrared ray 1 representative of the remote control signal is received by the infrared photodiode 10, and shaped and amplified by the amplifier 20 to provide a corresponding output signal $S_d$. If the remote control signal is a waveform having a carrier as illustrated by the waveform A of FIG. 1, the output signal $S_d$ is the waveform $S_{dA}$ as shown in FIG. 4, and the counter 30 is cleared at the falling edge of each pulse of the waveform $S_{dA}$. The counter 30 is cleared at the falling edge of the first pulse of the waveform $S_dA$ and the output $S_{cA}$ of terminal Qn is changed from high logic state to low logic state. The falling edge of the pulse signals $S_{dA}$, $S_{dB}$ in FIGS. 4A, 4B are equivalent to a leading edge of the inverted pulses shown therein. A clock signal $S_{fA}$ is counted from the cleared time, and the counter 30 is again cleared at the falling edge of the second pulse of the waveform $S_{dA}$ which is again input before the previously set delay value is obtained and such an operation is repeated at the falling edge of each pulse. When the last pulse is input and no other input pulse appears, the counter 30 continually counts the pulses of clock signal $S_{fA}$ until the previously determined value is obtained. When the predetermined delay value is obtained, the output terminal Qn is changed from the low state to the high state. Since the supply of the clock signal (waveform $S_{SfA}$ of FIG. 4A) supplied to the clock terminal CK of the counter 30 through the gate 40 is stopped by a transition from the low logic state to the high logic state, the counter 30 maintains the high state at the counter output terminal Qn until a subsequent remote control signal is input. Thus, the output terminal Qn of the counter 30 outputs a pulse waveform having the pulse width such as the waveform $S_{cA}$ of FIG. 4A, i.e., D=W+td, which is the sum of the actual waveform width W of the remote control signal and the delay time td of the counter 30.

On the other hand, in the waveform having no carrier, i.e., in the remote control signal system of the waveform B of FIG. 1, the waveforms $S_{dB}$, $S_{cB}$ & $S_{fB}$ of FIG. 4B are obtained by operations that are identical to the aforementioned operations.

With reference to FIGS. 5 through 7 illustrating the program of the present invention, first, the microprocessor 50 initiates the system by the main program shown in FIG. 5 (step 100). After that, it checks whether the operation mode is in a waveform input mode (step 101), and if not, the general program routine is carried out (step 102), and if it is in the waveform input mode, the capacity of the memory buffer set to carry out the waveform input mode is examined (step 103). If the assigned memory buffer is full of data, the input waveform data and time out processing routine 104 is carried out. If not, the time out is checked (step 105) and if it has timed out, the input waveform data and time out processing routine (step 104) is carried out. If the time out has not occurred, the time out is set in the internal timer and the 16-bit internal counter is turned on and the input port $\overline{INT1}$ is enabled (step 105).

In step 106, if the signal state supplied to the input port $\overline{INT1}$ transits from the high state to the low state, the first interrupt routine in FIG. 6 is carried out. The first interrupt routine disables the input port $\overline{INT1}$ and enables the input port INT2 (step 201). And the current value of the 16-bit internal counter turned on in step 106 of the main program is stored (step 202). This value is stored in the memory buffer as the value of the failing edge of the waveform width of the remote control signal. After step 202, the microprocessor is returned to the first interrupt generating position, that is, the connecting node N2 upon receiving the RETURN order.

Next, the main program checks whether the signal state supplied to the input port PA is at a low state (step 107), and if the low state is maintained, step 107 is repeated, and if the low state transits to the high state, the internal PA counter value is increased by 1 (step 108). After that, it checks whether the signal state supplied to the input port PA is at a high state (109), and if the high state is maintained, step 109 is repeated, and when the high state transits to the low state, a return to the connecting node N2 takes place and step 107 is again carried out. Steps 107 to 109 are repeatedly carried out, and when the state of the signal supplied to the input port INT2 transits from the low state to the high state, the second interrupt routine in FIG. 7 is carried out.

The second interrupt routine stores the current value of the 16-bit internal counter at the time when interrupt is required (step 301) and stores the value of the PA counter (step 302). After step 302, the memory buffer is checked to determine whether it is full of data (step 303), and if not, the value of the PA counter is set to "1" and the internal timer is initialized to reset the time out (step 304). After step 304, the input port INT2 is disabled and the input port $\overline{INT1}$ is enabled (305). After step 305, the microprocessor receives the RETURN order to go back to the connecting node N2 of the main program.

When the memory buffer is determined to be full of data in step 303, the value of the PA counter is set to "1" and the input port $\overline{INT1}$ is disabled and the system is initialized (step 307). After step 307, the vector value for jumping to the connecting node N1 of the main program is set in the stack (step 308), then the microprocessor receives the RETURN order to return to the connecting node N1, thereby resetting the waveform input mode.

When the time out is set, the timer routine in FIG. 7 starts the time out count (step 401), and checks whether a time out has occurred (step 402). If a time out has not occurred, the microprocessor receives the RETURN order to return to the connecting node N2 and if a time out has occurred, the aforementioned steps 307 and 308 are sequentially carried out and the microprocessor then receives the RETURN order to return to the connecting node N1.

In the present invention having the aforementioned constitution, when the waveform of the remote control signal is received, the envelope of the input waveform is detected by the counter, so that the error value generated during the envelope detection can be kept constant regardless of the temperature change or other such potential affectations on the device characteristics. Accordingly, the waveform width of the remote control signal can be measured more exactly, compared with the method for detecting the envelope of the input waveform by the RC value according to the conventional method.

What is claimed:

1. A circuit for measuring a waveform width of a remote control signal, comprising:
   receiving means for receiving a remote control signal exhibiting at least one pulse having a period;
   amplifying means coupled to said receiving means and having an output terminal, for providing an amplified control signal by shaping and amplifying said remote control signal received by said receiving means;
   counting means connected to said output terminal of said amplifying means and having an input terminal, for receiving clock pulses, for making a first count of said clock pulses starting at a leading edge of each pulse of the amplified control signal, and for generating an output signal when said first count reaches a predetermined value, said predetermined value being slightly longer than a pulse period of said amplified control signal by a selected delay value;
   gating means for gating said clock pulses supplied to said counting means; and
   microprocessor means connected to said amplifying means and said counting means, for providing said clock pulses to said gating means and making a second count of said clock pulses in response to reception of said amplified control signal and terminating said second count of said clock pulses in response to said output signal indicating that said first count has reached said predetermined value, and for calculating a waveform width of said amplified control signal by subtracting said selected delay value from said second count, corresponding to the waveform width of the remote control signal.

2. The circuit for measuring a waveform width of a remote control signal as claimed in claim 1, wherein said microprocessor means comprises:
   an internal timer for generating said clock pulses;
   a first internal counter for making said second count of said clock pulses starting from the leading edge of a first pulse of said amplified control signal and terminating said second count when second count said reaches said predetermined value;
   a second internal counter for making a third count by counting pulses of said amplified signal; and
   an internal memory buffer for storing said second count and for storing said third count when said first count reaches said predetermined value.

3. The circuit for measuring a waveform width as claimed in claim 2, wherein said predetermined value is set by adding a period of each pulse of said amplified control signal with said selected delay value.

4. The circuit for measuring a waveform width as claimed in claim 3, wherein said microprocessor means calculates the waveform width of said remote control signal by subtracting said selected delay time from a total sum of the counted values of said first internal counter stored in said internal memory buffer.

5. The circuit for measuring a waveform width as claimed in claim 4, wherein said microprocessor means is reset to a waveform input mode when said internal memory buffer is full of data and when a predetermined time set by said internal timer expires.

6. A method for measuring a waveform width of a remote control signal, comprising the steps of:
   receiving a remote control signal exhibiting at least one pulse having a period, transmitted by a remote controller;
   providing an amplified control signal by shaping and amplifying the remote control signal received;
   generating a plurality of clock pulses in response to provision of said amplified control signal;
   making a first count of said clock pulses starting at a falling edge of each pulse of said amplified control signal until said first count reaches a first value corresponding to the sum of a period of said pulse of said amplified control signal and a selected delay period;
   making a second count of said clock pulses starting at the falling edge of a first pulse of said amplified control signal and determining said second count when said first count reaches said first value; and
   measuring a waveform width of said amplified control signal by subtracting a second value from said second count, said second value corresponding to said selected delay period, corresponding to the waveform width of the remote control signal.

7. A circuit for measuring a waveform width of a remote control signal, comprising:
   means for receiving a remote control signal transmitted by a remote controller, said remote control signal exhibiting at least one pulse exhibiting a period;
   amplifying means coupled to said receiving means and having an output terminal providing an amplified control signal exhibiting a pulse by shaping and amplifying said remote control signal received by said receiving means;
   counting means connected to said output terminal of said amplifying means and having an input terminal for receiving clock pulses, for making a first count of said clock pulses starting at a leading edge of each pulse of the amplified control signal and for generating an output signal when said first count reaches a first value, said first value being slightly longer by a selected delay value than a period of said pulse exhibited by amplified control signal;
   gate means for gating said clock pulses to said counter means in dependence upon said output signal; and
   processor means connected to said amplifier means and said counter means, for providing said clock pulses to said gate means and making a second count of said clock pulses at the falling edge of a first pulse of said amplified control signal until reception of said output signal of said counter means, and for measuring a waveform width of said remote control signal by subtracting a second predetermined value corresponding to said delay value from said second count.

8. The circuit for measuring a waveform width of a remote control signal as claimed in claim 7, wherein said processor means comprises:

an internal timer for generating said clock pulses, a first internal counter for making said second count of said clock pulses starting from the falling edge of said first pulse of said amplified control signal, and a second internal counter for making a third count of pulses of said amplified control signal.

9. The circuit for measuring a waveform width of a remote control signal as claimed in claim 7, wherein:

said gate means is an AND gate having a first and inverted terminal connected to said counter means to receive said output signal of said counter means and a second and non-inverted terminal connected to said processor means to receive said clock pulses, and said means for receiving said remote control signal is an infrared photodiode.

10. The circuit for measuring a waveform width of a remote control signal as claimed in claim 8, wherein said processor means stores a first value of said first count of said first internal counter in an internal memory buffer starting at said falling edge of said first pulse of said remote control signal, stores both a second value of said first count of said first internal counter in said internal memory buffer and said third count of said second internal counter in said internal memory buffer when said output signal is generated by said counter means, and measures the waveform width of said remote control signal by subtracting both said second predetermined value and said first value of said first count from the second value of said first count stored in said internal memory buffer.

11. The circuit for measuring a waveform width of a remote control signal as claimed in claim 10, wherein said processor means resets an operational mode for measuring said waveform width of said remote control signal when said internal memory buffer is full, and when a predetermined time set by an internal timer is expired for detecting said remote control signal.

12. A method for measuring a waveform width of remote control signals, comprising the steps of:

receiving remote control signals exhibiting at least one pulse having a period;

generating clock pulses in response to provision of said remote control signals;

making a first count of said clock pulses starting at a falling edge of each pulse of said remote control signals and generating an output when said first count reaches a first predetermined value corresponding to the sum of a pulse period and a selected delay value;

making a second count of said clock pulses starting at said falling edge of a first pulse of said remote control signals and storing said second count in response to said output when said first count reaches said first predetermined value; and measuring a waveform width of said remote control signals upon termination of said first count of clock pulses by subtracting a second predetermined value corresponding to said selected delay value from said second count.

13. The method of claim 12, further comprising the steps of making a determination of a period of each pulse and a number of pulses within a waveform of said remote control signals, and terminating said first count in dependence upon said determination.

14. The method of claim 13, further comprised of setting said first predetermined value by adding a selected delay time period to said period of each pulse of said remote control signals, and said selected delay time period being longer than said period of each pulse of said remote control signals so that the value of said first count does not reach said first predetermined value before arrival of another pulse within a waveform of said remote control signals.

15. The method of claim 14, wherein said second predetermined value is a value of said selected delay time period.

16. A method for measuring a pulse width of a signal, comprising the steps of:

receiving a signal exhibiting at least a pulse having a period;

providing a plurality of clock pulses;

simultaneously making a first count and a second count of said clock pulses starting at a falling edge of said pulse of said signal;

providing an output when a value of said first count reaches a first predetermined value, wherein said first predetermined value is set slightly longer than a pulse period of said signal by a selected delay value;

making a determination of a value of said second count in response to said output when the value of said first count reaches said first predetermined value; and measuring the pulse width of said signal upon termination of said first count of said clock pulses by subtracting a second predetermined value from the value of said second count, wherein said second predetermined value corresponds to said selected delay value.

17. The method of claim 16, wherein said first predetermined value is set by adding a selected delay time period to said period of said pulse of said signal.

18. The method of claim 17, wherein said second predetermined value is a value of said selected delay time period.

19. A circuit for measuring a waveform width of a remote control signal, comprising:

means for providing a remote control signal exhibiting at least one pulse having a period;

counting means coupled to said means for providing, and having a clock input, being cleared at a falling edge of each pulse of said remote control signal, for making a first count of clock pulses starting at the falling edge of each pulse of said remote control signal, and generating an output pulse after a value of said first count reaches a first predetermined value corresponding to the sum of a pulse period and a selected delay value;

gating means for passing said clock pulses to said counting means, said gating means being disabled in response to said output of said counting means to prevent said clock pulses from being passed to said counting means when said first count reaches said first predetermined value; and processor means for generating said clock pulses in response to provision of said remote control signal, for making a second count of said clock pulses in response to provision of said remote control signal and storing a value of said second count in response to said output of said counting means, and for measuring the waveform width of said remote control signal by subtracting a second predetermined value corresponding to said delay value from said value of said second count.

20. The circuit as claimed in claim 19, wherein said processor means comprises:
- an internal timer for generating said clock pulses;
- an internal counter for making said second count of said clock pulses starting from the falling edge of a first pulse of said remote control signal, said internal counter being disabled in response to said output of said counting means; and
- an internal memory for storing a value of said second count in response to said output of said counting means when the value of said first count reaches said first predetermined value.

21. The circuit as claimed in claim 20, wherein said first predetermined value is set by adding a selected delay time period to a period of each pulse of said remote control signal, said selected delay time period being longer than said period of each pulse of said remote control signal so that the value of said first count does not reach said first predetermined value before arrival of another pulse within a waveform of said remote control signal.

22. The circuit as claimed in claim 21, wherein said second predetermined value is a value of said selected delay time period.

23. The circuit as claimed in claim 22, wherein said processor means measures the waveform width of said remote control signals by subtracting said second predetermined value from the value of said second count stored in said internal memory.

24. An apparatus for measuring a waveform width of a remote control signal, comprising:
- a receiver for receiving a remote control signal exhibiting at least one pulse having a period transmitted by a remote controller;
- a counter connected to receive said remote control signal from said receiver, and having an input for receiving clock pulses, for generating an output pulse of a first logic state in response to reception of a falling edge of a first pulse of said remote control signal and simultaneously making a first count of clock pulses that is cleared at the falling edge of each pulse of said remote control signal, and for generating said output pulse of a second logic state when a value of said first count reaches a first predetermined value, said first predetermined value being slightly longer than a pulse period of said remote control signal by a selected delay value;
- a logic gate for passing said clock pulses to said counter, said logic gate being disabled in response to said output pulse of said second logic state to prevent said clock pulses from being passed to said counter; and
- a microprocessor comprising a timer for generating said clock pulses, an internal counter for making a second count of said clock pulses starting at the falling edge of said first pulse of said remote control signal, and a memory for storing a value of said second count when said output pulse of said first logic state changes to said second logic state, said microprocessor measuring a waveform width of said remote control signals by subtracting a second predetermined value corresponding to said selected delay value from said value of said second count.

25. The apparatus as claimed in claim 24, further comprised of means for determining a period of each pulse of said remote control signal, and said first predetermined value being set by adding a selected delay time period to said period of each pulse of said remote control signal, said selected delay time period being longer than said period of each pulse of said remote control signal and having a value corresponding to said second predetermined value.

26. An apparatus for measuring a waveform width of a remote control signal, comprising:
- receiver means for receiving a remote control signal exhibiting at least one pulse having a period;
- counter means connected to receive said remote control signal from said receiving means, and having a clock input, responsive to reception of a falling edge of a first pulse of said remote control signal, for making a first count of clock pulses that is cleared at the falling edge of each pulse of said remote control signal, and generating an output pulse when a value of said first count reaches a first predetermined value corresponding to the sum of a pulse period and a selected delay time period; and
- processor means for generating said clock pulses and making a second count of said clock pulses starting at the falling edge of said first pulse of said remote control signal, storing a value of said second count in response to said output pulse, and measuring the waveform width of said remote control signal by changing the value of said second count by a value corresponding to said selected delay time period.

27. The apparatus as claimed in claim 26, further comprised of means for determining said pulse period of said remote control signal, and said first predetermined value being set by changing said pulse period of said remote control signal by said selected delay time period, said selected delay time period being longer than said pulse period of said remote control signal.

* * * * *